(12) United States Patent
Devine

(10) Patent No.: US 7,276,697 B2
(45) Date of Patent: Oct. 2, 2007

(54) INFRARED APPARATUS

(75) Inventor: Michael Leslie Devine, Milton Keynes (GB)

(73) Assignee: Calex Electronics Limited, Bedfordshire (GB)

( * ) Notice: Subject to any disclaimer, the term of this patent is extended or adjusted under 35 U.S.C. 154(b) by 173 days.

(21) Appl. No.: 10/503,188

(22) PCT Filed: Feb. 3, 2003

(86) PCT No.: PCT/GB03/00453

§ 371 (c)(1), (2), (4) Date: May 31, 2005

(87) PCT Pub. No.: WO03/064985

PCT Pub. Date: Aug. 7, 2003

(65) Prior Publication Data

US 2005/0224715 A1 Oct. 13, 2005

(30) Foreign Application Priority Data

Feb. 1, 2002 (GB) ................. 0202319.0

(51) Int. Cl.
*G01J 5/00* (2006.01)
(52) U.S. Cl. .................................. 250/338.1
(58) Field of Classification Search .............. 250/338.1
See application file for complete search history.

(56) References Cited

U.S. PATENT DOCUMENTS 5,638,599 A * 6/1997 Beratan et al. ............... 29/854
5,803,604 A * 9/1998 Pompei ....................... 374/181

FOREIGN PATENT DOCUMENTS

GB 2291499 1/1996

OTHER PUBLICATIONS

International Search Report from PCT/GB03/00453.

* cited by examiner

*Primary Examiner*—David Porta
*Assistant Examiner*—Mindy Vu
(74) *Attorney, Agent, or Firm*—Calfee, Halter & Griswold LLP

(57) ABSTRACT

Apparatus for protection against undesired thermal transfer comprising a printed circuit board (15), an infrared sensing device (100) electrically connected to the printed circuit board (15) by way of an electrical lead (12), and solid thermally insulating material (18, 20) between the board (15) and the device (100) and protecting that side of the device (100) facing the board (15) from thermal transfer from the board (15) to the device (100). The solid thermally insulating material (18) bounds a passageway (19) in the material (18) through which the lead (12) passes. Advantageously, the in sensing device (100) is in thermal communication with a heat sink (14) and the solid thermally insulating material (20) protects the heat sink (14) also against such thermal transfer from the board (15), i.e. thermal radiation from the board (15) and thermal convection currents induced by the board (15).

38 Claims, 4 Drawing Sheets

INFRARED APPARATUS

Figure 1:
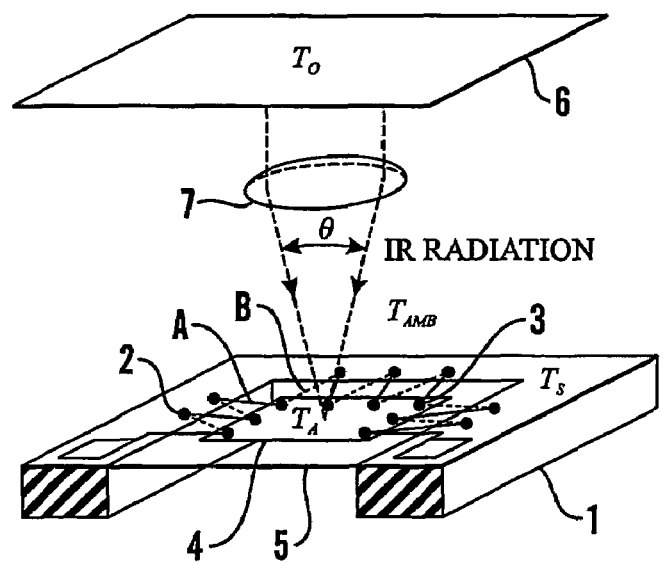

This invention relates to apparatus for protection against undesired thermal transfer, in particular to the use of thermopile sensors in non-contact infrared (IR) thermometry.

In conventional non-contact IR thermometers, temperature gradients arise within a thermopile which are responsible for generating temperature measurement errors. Such gradients are caused by leakage heat flow between the back of the thermopile, where electrical connections are made, and other components within a housing of the IR thermometer.

A conventional thin-film thermopile is a voltage-generating device made up from a large number of thermocouples connected in series. Based on the Seebeck effect, a thermocouple is a circuit made up from thin wire of two dissimilar materials. One end of a thermocouple is referred to as the hot junction and the other the cold junction. When the junctions are at different temperatures a small emf is generated; however, connecting several thermocouples in series produces a relatively large useful electrical output signal.

GB-A-2291499 discloses a DC stable infrared detector compensation system in which, to reduce noise in an IR remote temperature sensing device owing to thermal transients generated by an IR detector and a compensating detector shielded from IR radiation, very thin connecting wires (having a thermal conductance of from 0.13 to 0.2 mW/°K) are used to reduce the heat load of the detector leads. In order further to reduce thermal noise, a thermally insulating enclosure may surround the thin wires. Each of the two detectors may be a thermopile sealed in an individual housing mounted in a heat sink in the form of an aluminium block. Extending from the heat sink at a location within the enclosure to a location outside the enclosure is a circuit board to which the detectors are connected for processing the sensing and compensating signals to cancel any offset voltage due to change of the temperature of the IR detector. The electrical connections from the detectors to the circuit board include not only the very thin connecting wires but also thicker earthing wires. In a preferred embodiment, the thin wires are copper wires having a diameter of 0.08 mm. and a length of about 1.5 cm. In order to install the thin wires, the conventional leads from the detectors are trimmed to lengths of about 3 mm. and the very thin wires are attached to the leads by knotting the wires to hold them in place and then soldering the wires to the trimmed detector leads.

According to a first aspect of the present invention, there is provided apparatus comprising a printed circuit board, an infrared sensing device electrically connected to said printed circuit board, and solid thermally insulating material between said board and said device and protecting that side of said device facing said board from thermal transfer from said board to said device.

According to a second aspect of the present invention, there is provided apparatus comprising an infrared sensing device, electrical circuitry, an electrical lead connecting said device to said circuitry, and solid thermally insulating material interposed between said device and said circuitry and protecting said device against thermal transfer from said circuitry to said device, and a passageway in said material and through which said lead passes.

Advantageously, the infrared sensing device is in thermal communication with a heat sink and the solid, thermally insulating material protects the heat sink also against such thermal transfer from the board, i.e. thermal radiation from the board and thermal convection currents induced by the board.

According to a third aspect of the present invention, there is provided apparatus comprising an infrared sensing device, electrical circuitry, an electrical conductor which is long and thin and connects said device to said circuitry, the length of said conductor being at least several centimetres.

The length of the conductor is advantageously between 10 cm. and 1 m. As regards the cross-sectional area of the conductor, this will depend upon the material from which it is made, but, for a copper conductor would advantageously be very roughly 0.01 $mm^2$.

According to a fourth aspect of the present invention, there is provided apparatus comprising an infrared sensing device, electrical circuitry, an electrical conductor which connects said device to said circuitry, and a heat sink device in thermally conductive communication with said conductor.

Owing to these four aspects of the invention, it is possible to reduce temperature gradients in the infrared sensing device which produce temperature measurement errors.

Advantageously, the thermal communication between the heat sink device and the conductor takes place at portions of the heat sink device relatively far from the infrared sensing device.

Furthermore, the conductor is preferably incorporated in a flexible printed circuit board itself in thermally conductive communication with the heat sink device.

According to a fifth aspect of the present invention, there is provided apparatus comprising an element which emits thermal energy, a heat sink device, and a heat interceptor located between said element and said device and protecting at least a major part of the external surface of said heat sink device against said thermal energy.

Owing to this aspect of the invention, it is possible to reduce the extent to which a heat sink is subjected to externally emitted thermal energy.

Preferred embodiments of the invention provide schemes for thermally isolating the back of a thermopile from the conducted, convected and radiated leakage heat which would otherwise flow to and from the back of the thermopile. Such isolation schemes include the use of conductors wrapped around a heat sink, a plastics cap and a rubber sealing ring.

Figure 2:
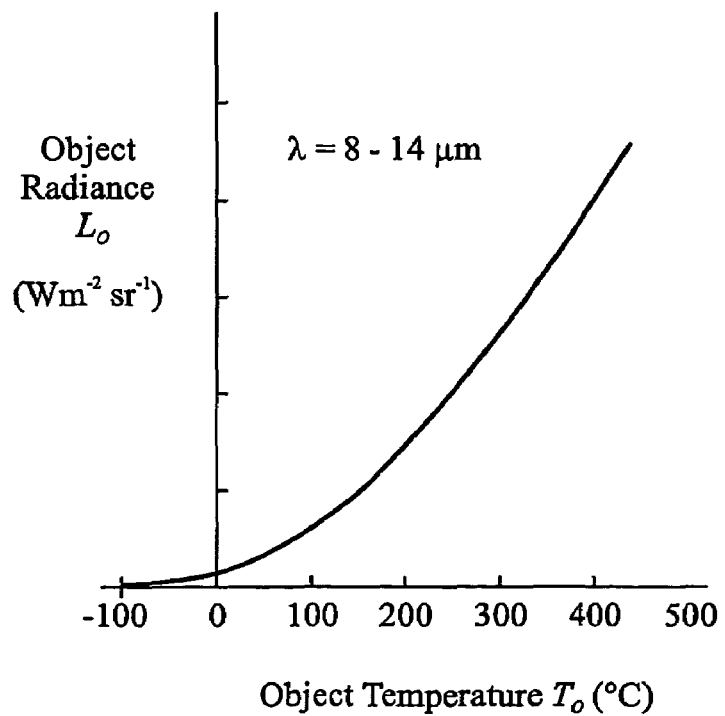
Figure 3:
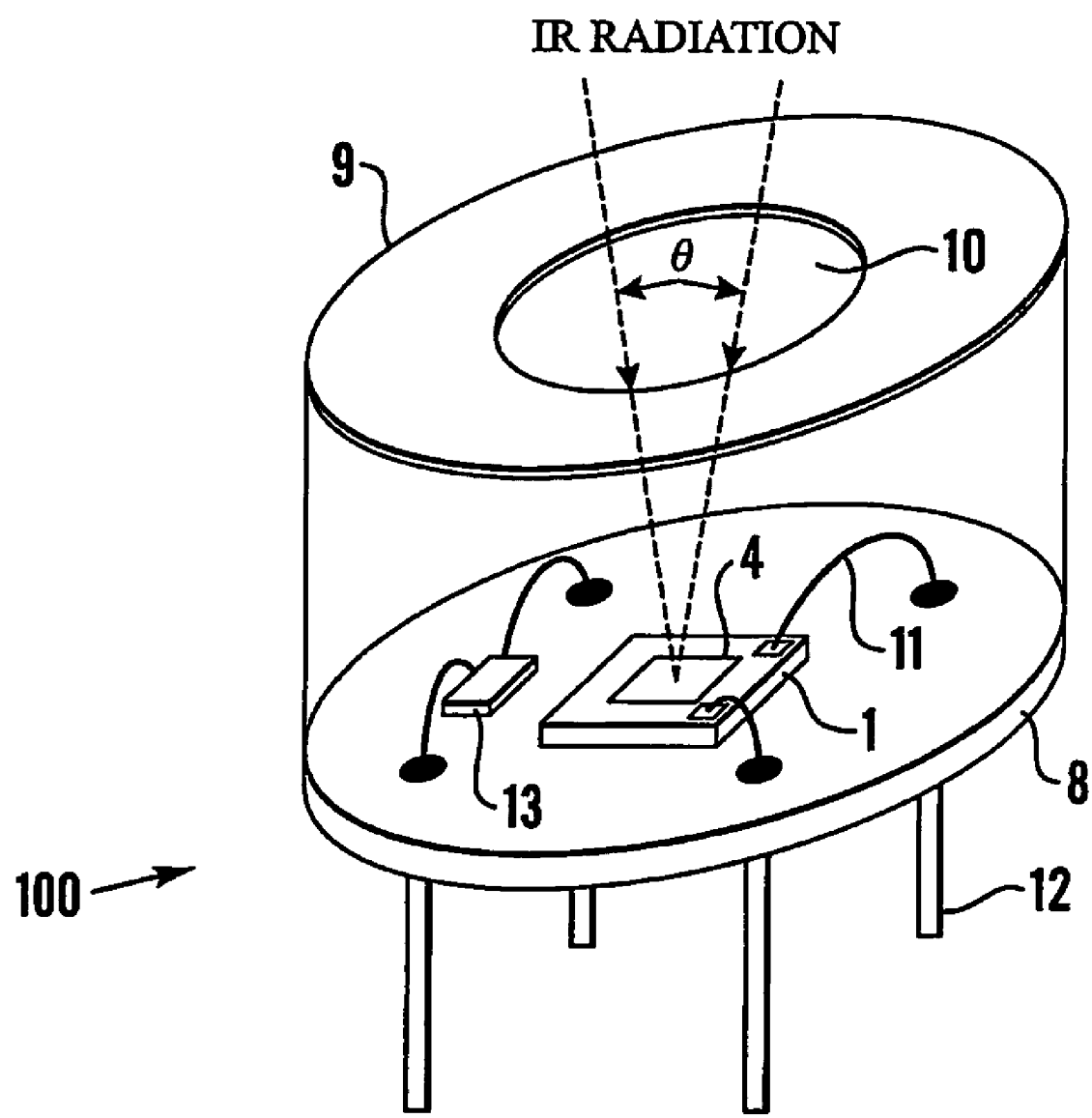
Figure 4:
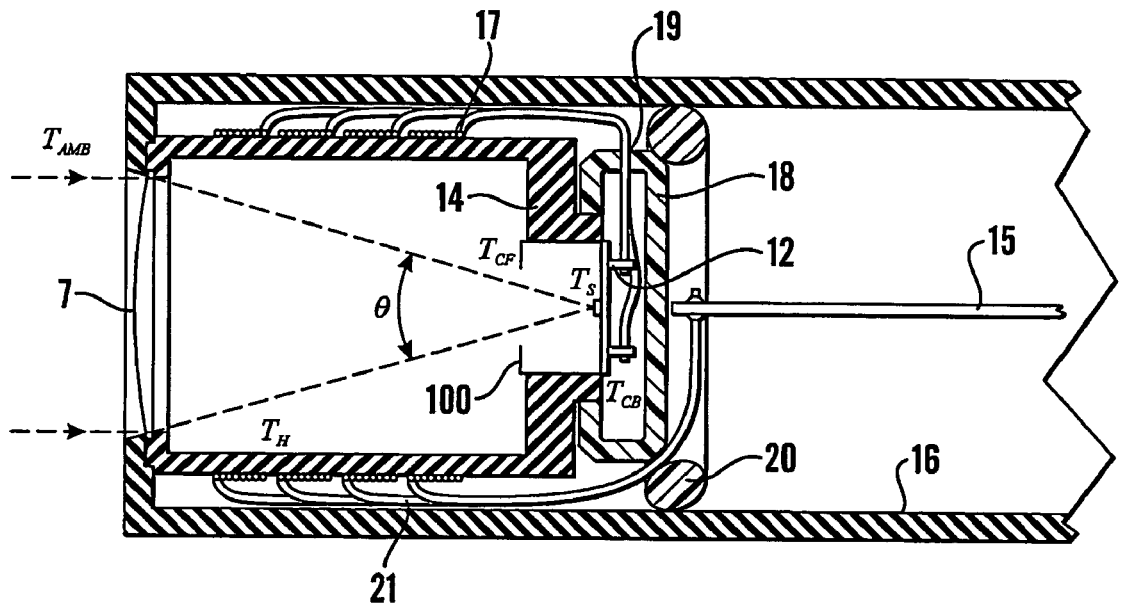
Figure 5:
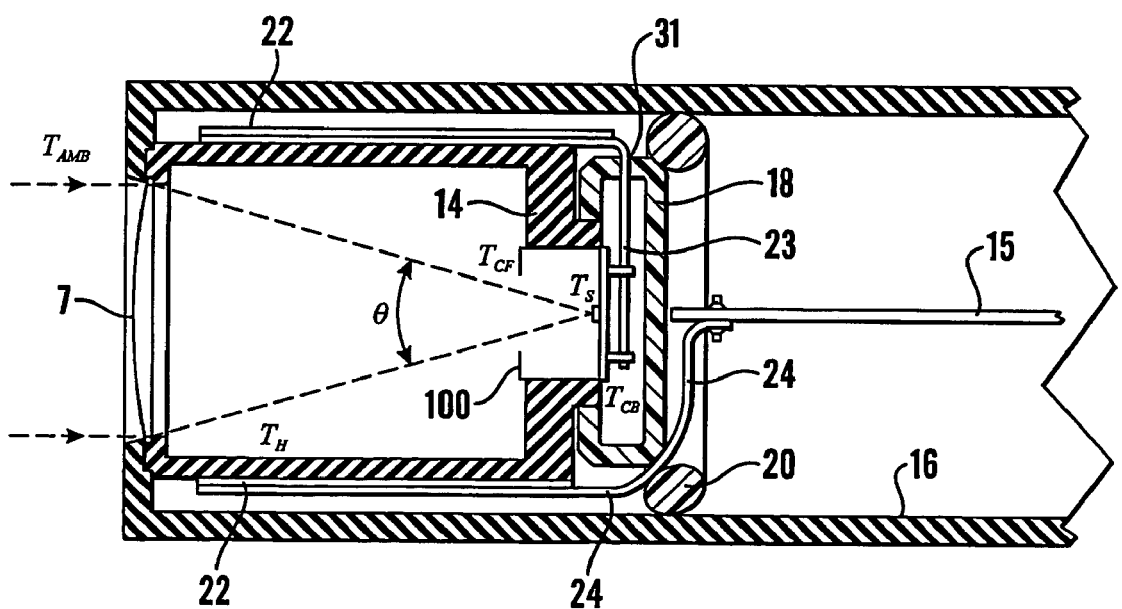
Figure 6:
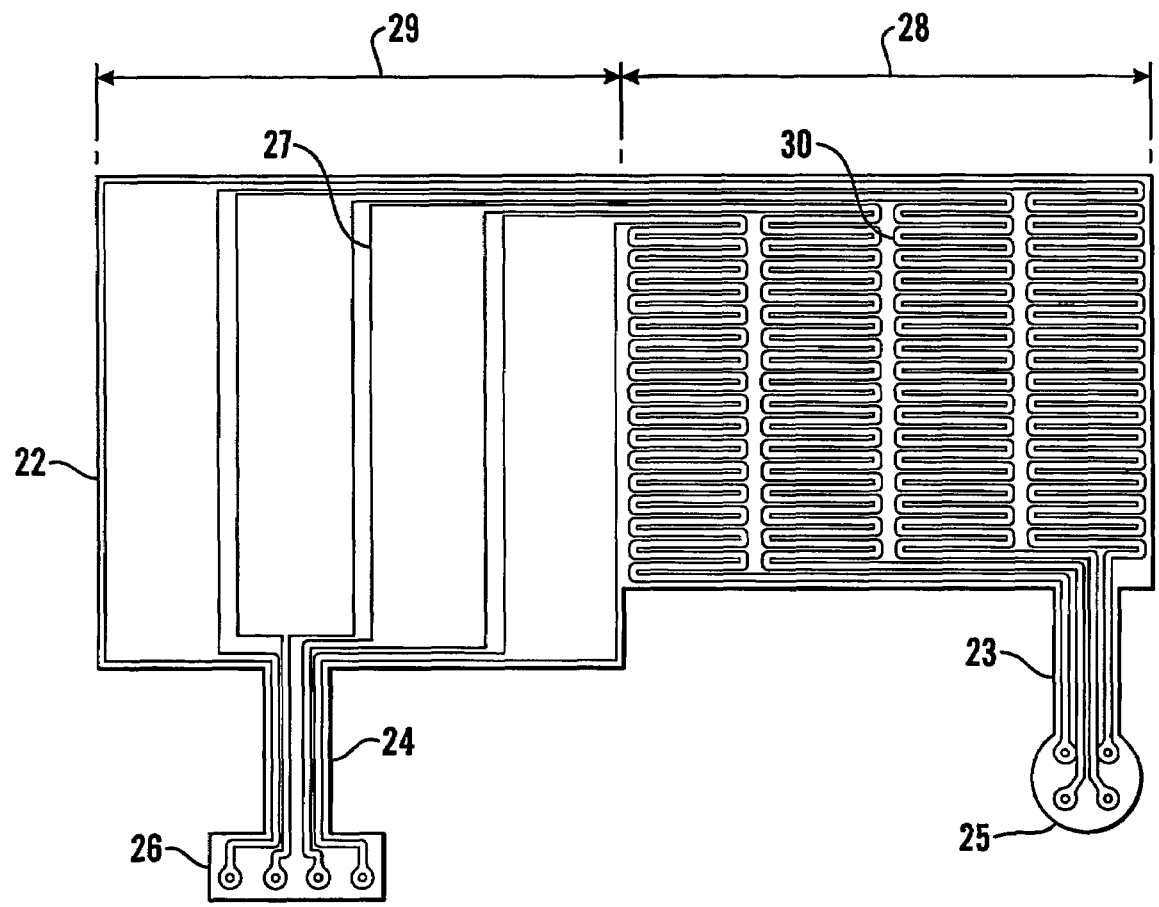

In order that the invention may be clearly and completely disclosed, reference will now be made, by way of example, to the accompanying drawings, in which FIG. 1 is a diagrammatic perspective view of a conventional thermopile, FIG. 2 is a graph showing a typical curve of radiance on an object plotted against temperature of the object, FIG. 3 is a perspective view of the conventional thermopile, FIG. 4 is an axial section through a first embodiment of an IR thermometer according to the invention, FIG. 5 is a view similar to FIG. 4, but of a second embodiment of an IR thermometer according to the invention, and FIG. 6 is a developed view of part of the IR thermometer of FIG. 5.

Referring to the drawings, FIG. 1 shows conductors of the thermocouples made from dissimilar materials A and B deposited on a silicon substrate 1 with the cold junctions 2 located at the periphery, and the hot junctions 3 organised as a miniature array at the centre. This array or absorber 4 is thermally insulated from the cold junctions 2 by etching the substrate to produce an extremely thin self-supporting membrane 5. As its purpose is to detect the IR radiation produced by an object 6 at a temperature $T_o$, the absorber 4 is blackened to increase its absorption of incident radiation and to maximise its resulting temperature rise as the radiation is transformed into heat. The cold junctions 2 are mounted on the substrate 1 and therefore they are ideally at or near ambient temperature $T_{AMB}$.

Detecting IR energy over a wide band is not recommended in IR thermometry applications as unwanted energy absorption occurs in the atmosphere at certain wavelengths. To overcome this problem, an optical bandpass filter (not shown) is usually placed in front of the absorber 4. Generally this filter is designed to pass IR radiation only for wavelengths in the range 8 to 14 µm where the atmospheric absorption is minimal. FIG. 2 shows that $L_o$ is a severe non-linear function of the object temperature $T_o$, where $L_o$ is the radiance of the object and is the radiant power emitted in a specified direction per unit projected area of surface, per unit solid angle: it is expressed in watts per steradian per square meter (W sr$^{-1}$m$^{-2}$).

An appropriate optical system 7 is employed to collect the radiation from the object 6 and focus it on the absorber 4.

FIG. 3 shows the typical construction of a thermopile 100. The substrate 1 supporting the thermally isolated absorber 4 is mounted with good thermal contact on a standard TO-transistor baseplate 8. A transistor cap 9 having a window 10 is hermetically mounted on the baseplate 8, thus sealing the sensor chip 1 inside. Usually the window 10 is fitted with material having the appropriate optical characteristics to satisfy the IR bandpass filter requirements. Bonding wires 11 between the substrate 1 and baseplate leads 12 allow the generated thermopile emf to be brought out to the processing electronics (not shown).

A thermopile can only be used to measure the temperature of an object relative to the absorber temperature $T_A$: for absolute temperature measurements, knowledge of $T_A$ is required. Unfortunately, as the absorber 4 is thermally isolated from the substrate 1 it is not possible to measure $T_A$ directly. However, as the substrate temperature $T_S$ tracks $T_A$ to within a few tenths of a degree, a separate substrate temperature measuring sensor can be used to estimate $T_A$. The sensor can be external to the thermopile case; however, the preferred solution, as illustrated in FIG. 3, is to use a thermopile with an integral sensor such as a thermistor or resistance temperature device (RTD) 13. Mounting the sensor in good thermal contact with the baseplate 8 and close to the substrate 1 will ensure a good estimate of $T_S$ and hence $T_A$.

FIG. 4 shows the principal elements of an IR non-contact thermometer. To reduce the effects of rapid changes of ambient temperature $T_{AMB}$, the thermopile case 8, 9 is usually mounted in a heat-sink 14 of large relative mass. A lens 7 is used to collect the IR radiation from the object 6 the temperature of which is being determined and focus it on the absorber area. Case leads 12 connect the thermopile to the electronic system board 15 which processes the generated emf to produce a linear measure of the object temperature. The whole assembly is enclosed in a metal or plastics housing 16. Usually, a hand-held non-contact thermometer presents the measured temperature to the user on an integral display, whilst an on-line thermometer generates either a voltage or a current proportional to temperature for external use.

The absorber temperature $T_A$ of a typical thermopile tends to follow the substrate temperature $T_S$ to within a few tenths of a degree. Thus, because the substrate 1 is mounted with good thermal contact on the baseplate 8 of the case 8,9, temperatures $T_A$ and $T_S$, and the case back temperatures $T_{CB}$ will be practically the same; that is:

$$T_A = T_S = T_{CB}.$$

Furthermore, since in FIG. 4 the metal windowed cap of the thermopile 100 is welded to the baseplate and the case is mounted with good thermal contact in the heatsink 14, the case front temperature $T_{CF}$ and the heatsink temperature $T_H$ will ideally track the case back temperature. That is:

$$T_{CF} = T_H = T_{CB}.$$

Accordingly, in these circumstances, with the principal parts of the IR thermometer all at the same temperature (i.e. $T_A = T_S = T_{CB} = T_{CF} = T_H$), no radiant energy will flow between the heatsink 14 and absorber 4, nor will it flow inside the TO transistor case 8,9 between the case front and the absorber 4.

Clearly, the only transfer would be that which is wanted, i.e. between the object and absorber.

Unfortunately, this ideal state cannot always be attained in practice. Recent improvements in thermopile technology, optics, and electronics have enabled non-contact IR thermometers to be made much smaller and more compact in their construction. As a consequence, stray heat sources which previously caused only second order measurement errors have become much more significant. In particular, one of the major error contributions is by stray heat flowing towards the back of the case 8,9 and inducing unwanted internal temperature gradients. To appreciate the problem, consider the components of heat which can flow to the back of the thermopile 100. These are:

heat conducted along the leads 12 from the electronic processing circuit board 15, heat radiated from the inside of the housing 16 and from the processing board 15, and heat convected from within the housing 16.

Mathematical modeling of the temperature distribution within the thermopile indicates that these heat components cause the heatsink and case front temperatures to be different from the absorber temperature $T_A$. $T_H$ and $T_{CF}$ are greatly influenced by the ambient temperature $T_{AMB}$ of the space in which the IR thermometer is being used whereas $T_{CB}$, $T_S$ and $T_A$ tend to follow the internal temperature of the instrument.

Analysis has shown that internal thermopile-temperature gradients of only a few tenths ° C. can induce relatively large leakage radiation components which in turn can produce relatively large object temperature measurement errors.

To minimise the undesirable effect of leakage radiant heat flow, i.e. between the heatsink 14 and the absorber 4 and inside the thermopile 100 between the case front and the absorber 4, the thermopile 100 should be thermally isolated from other components within the IR thermometer. The isolation method should ensure minimum heat flow to the back of the thermopile 100, and hence limit the unwanted temperature gradients within the thermopile. However, whilst providing good thermal isolation, the isolation method should not prejudicially affect the electrical connections between the thermopile 100 and the electronic processing board 15.

FIG. 4 illustrates a scheme that provides such thermal isolation. However, each thermopile lead 12 includes a coil 17 of thin insulated copper wire wrapped around the heatsink 14 to reduce the conducted heat component. The thermopile 100 has wires whereby four terminals of the thermopile are connected to respective ends of the coils 17, and the other ends of the coils 17 are connected to the processing circuitry 15. Whilst still providing the necessary electrical connection, the coils 17 limit the conducted heat flow to the thermopile 100 by providing a high value of thermal resistance, by taking the heat produced by the processing board 15 to the front of the heatsink 14 and thus well away from the case back, and by allowing residual heat to flow into the heatsink 14.

The effect of radiated heat from the board 15 and the inside surface of the housing 16 is reduced by shrouding the back of the thermopile 100 with a cap 18 of plastics or similar material. Small diameter holes 19 are required in the cap 18 to accommodate the connecting wire linking the thermopile 100 to the coil 17.

The effect of convected heat from the board 15 and the inside surface of the housing 16 is also reduced by the cap 18; however, the provision of a rubber sealing ring 20 to close the gap between the thermometer housing 16 and the plastics cap 18 reduces this effect even further. It prevents heat from finding its way to the heatsink 14 and flowing to the case back via the coils 17. The connecting wire 21 linking the coil 17 to the processing board 15 passes between the cap 18 and the rubber sealing ring 20.

In effect, the coils 17, plastics cap 18 and rubber sealing ring 20 thermally isolate the thermopile 100 from other components within the instrument, allowing it to behave as an almost ideal thermal radiation sensor. That is, since temperatures $T_A$, $T_S$, $T_{CB}$, $T_{CF}$ and $T_H$ are now all practically the same and tend to follow the ambient temperature $T_{AMB}$, the temperature of the object 6 being measured can be reliably determined.

The plastics cap 18 and the rubber sealing ring 20 for limiting the flow of convected and radiated heat to the back of the thermopile 100 are suggested here as a possible example. In practice, alternative thermal isolation techniques are possible, such as the use of potting compound, or the use of a barrier made of plastics or similar material which fits tightly to the inside of the housing 16.

As a manufacturing operation, wrapping coils of thin copper wire around a metal heatsink has a number of disadvantages, which are avoided in the preferred embodiment shown in FIG. 5 in which the thermometer structure is basically the same as in FIG. 4 but with the coils 17 of wire replaced by very thin flexible meanders made up from thin narrow copper tracks deposited on a thin flexible substrate to produce a flexible printed circuit board 22. This flexible printed circuit board 22 is wrapped around the heatsink 14 with its electrical terminating contacts arms 23 and 24 being connected to the thermopile terminal wires and to the processing circuitry board 15, respectively.

In this embodiment, each deposited copper track can be a few hundred microns wide and 20 to 35 centimetres long, thereby significantly increasing the thermal resistance to heat flow between the processing circuitry and the thermopile 100. The tracks on the board 22 run directly to the front of the heatsink 14 via the contact arm 24 and then wind their way back to the thermopile 100 via the thermopile contact arm 23. With this arrangement, the heat produced by the processing board 15 is kept well away from the back of the thermopile 100. As in the arrangement of FIG. 4, residual conducted heat is dumped in the heatsink 14.

FIG. 6, illustrates the layout of the flexible printed circuit board 22 for use with a four-terminal thermopile and shows the fine copper tracks between the thermopile contacts 25, on the one hand, and the processing board contacts 26, on the other hand. In this particular example, the flexible board 22 includes thermal radiation guard screens 27 which should introduce negligible additional manufacturing costs. The board 22 is designed to be wrapped in two layers 28,29 around the heatsink 14 with the thermopile contact arm 23 and processing board contact arm 24 positioned opposite each other.

The inner layer 28 includes the flexible meanders 30 whilst the outer layer 29 incorporates the radiation screens 27 which are relatively large copper areas. In essence, the screens 27 shield the flexible meanders 30 from thermal radiation which flows when the inside wall of the housing 16 and the flexible board 22 are at different temperatures. The screens 27 act to limit the radiation which, transformed into conducted heat, would otherwise flow to the back of the thermopile 100 via the layer 28. Instead, the transformed heat flows via the screens 27 to the front of the heatsink 14 well away from the back of the thermopile 100.

In this embodiment a slot 31 is required in the plastics cap 18 to accommodate the thermopile contact arm 23 whilst the processing board contact arm 24 passes between the cap 18 and the rubber sealing ring 20.

Compared with other methods, the use of flexible meanders 30, a plastics cap 18 and a rubber sealing ring 20 provides a very effective compact and relatively low cost way of thermally isolating the back of the thermopile 100.

The invention claimed is:

1. Apparatus comprising a printed circuit board, an infrared sensing device electrically connected to said printed circuit board, and solid thermally insulating material between said board and said device and protecting that side of said device facing said board from thermal transfer from said board to said device.

2. Apparatus according to claim 1, wherein said material comprises plastics.

3. Apparatus according to claim 1, wherein said device is electrically connected to said board as aforesaid by way of an electrical lead, and wherein said thermally insulating material bounds a passageway through which said lead passes.

4. Apparatus according to claim 3, wherein said lead is long and thin.

5. Apparatus according to claim 4, wherein the length of said lead is at least several centimetres.

6. Apparatus according to claim 5, wherein the length of said lead is between substantially 10 cm. and substantially 1 m.

7. Apparatus according to claim 4, wherein said lead is a copper conductor having a cross-sectional area of very roughly 0.01 mm$^2$.

8. Apparatus according to claim 1, wherein said material comprises a cap shrouding said side of said device facing said board.

9. Apparatus according to claim 1, and further comprising a housing enclosing said board, said device, and said material.

10. Apparatus according to claim 9, wherein said material comprises a cap shrouding said side of said device facing said board, and a sealing device interposed between said cap and said housing and sealing against heat transfer through a spacing between said cap and said housing.

11. Apparatus according to claim 10, wherein said sealing device is a rubber ring.

12. Apparatus according to claim 10, wherein said lead passes between said cap and said sealing device.

13. Apparatus according to claim 1, and further comprising a heat sink in thermal communication with said sensing device.

14. Apparatus according to claim 13, wherein said material protects said heat sink against thermal transfer from said printed circuit board.

15. Apparatus according to claim 13, wherein said device is electrically connected to said board as aforesaid by way of an electrical lead, wherein said thermally insulating material bounds a passageway through which said lead passes, and said heat sink is in thermal communication with said lead.

16. Apparatus according to claim 15, wherein said thermal communication between said heat sink and said lead takes place at portions of said heat sink relatively far from said sensing device.

17. Apparatus according to claim 13, wherein said lead is long and thin and is coiled around said heat sink.

18. Apparatus according to claim 13, wherein said lead is long and thin, said apparatus further comprising a flexible printed circuit board in thermal communication with said heat sink, said lead being in the form of a thin, narrow, deposited track of said flexible printed circuit board.

19. Apparatus according to claim 18, wherein said track is a few hundred microns wide and substantially 20 to substantially 35 centimetres long.

20. Apparatus according to claim 18, wherein said flexible printed circuit board is wrapped around said heat sink in an inner layer and an outer layer.

21. Apparatus according to claim 20, wherein said inner layer incorporates said track.

22. Apparatus according to claim 20, and further comprising a housing enclosing said board, said device, and said material, and a heat interceptor located between said housing and said heat sink and protecting at least a major part of an external surface of said heat sink against thermal energy emitted by said housing, wherein said outer layer incorporates said heat interceptor.

23. Apparatus according to claim 13, and further comprising a housing enclosing said board, said device, and said material, and a heat interceptor located between said housing and said heat sink and protecting at least a major part of an external surface of said heat sink against thermal energy emitted by said housing.

24. Apparatus according to claim 23, wherein said lead is long and thin, said apparatus further comprising a flexible printed circuit board in thermal communication with said heat sink, said lead being in the form of a thin, narrow, deposited track of said flexible printed circuit board, and wherein said heat interceptor is part of said flexible printed circuit board.

25. Apparatus according to claim 23, wherein said heat interceptor is in the form of a thermal radiation guard screen.

26. Apparatus according to claim 23, wherein said heat interceptor is thermally conductive and of relatively large area.

27. Apparatus according to claim 1 and in the form of a non-contact infra-red thermometer.

28. Apparatus comprising an infrared sensing device, electrical circuitry, an electrical lead connecting said device to said circuitry, and solid thermally insulating material interposed between said device and said circuitry and protecting said device against thermal transfer from said circuitry to said device, and a passageway in said material and through which said lead passes: said material comprising a car shrouding a side of said device facing said circuitry.

29. Apparatus according to claim 28, and further comprising a housing enclosing said circuitry, said device, and said material.

30. Apparatus according to claim 29, wherein said material also comprises a sealing device interposed between said cap and said housing and sealing against heat transfer through a spacing between said cap and said housing.

31. Apparatus according to claim 30, wherein said lead passes between said cap and said sealing device.

32. Apparatus comprising an infrared sensing device, electrical circuitry, and an electrical conductor which is long and thin and connects said device to said circuitry, the length of said conductor being at least several centimetres; said conductor being a copper conductor having a cross-sectional area of very roughly 0.01 mm$^2$.

33. Apparatus comprising an element which emits thermal energy, a heat sink device, and a heat interceptor located between said element and said device and protecting at least a major part of an external surface of said heat sink device against said thermal energy.

34. Apparatus according to claim 33, and further comprising an infra-red sensing device, said element being a housing.

35. Apparatus according to claim 33 and in the form of a non-contact infra-red thermometer.

36. Apparatus in the form of a non-contact infra-red thermometer and comprising an infrared sensing device, electrical circuitry, an electrical lead connecting said device to said circuitry, and solid thermally insulating material interposed between said device and said circuitry and protecting said device against thermal transfer from said circuitry to said device, and a passageway in said material and through which said lead passes.

37. Apparatus according to claim 36, wherein said track is a few hundred microns wide and substantially 20 to substantially 35 centimetres long.

38. Apparatus comprising an infrared sensing device, electrical circuitry, an electrical printed circuit board, and an electrical conductor which is long and thin and connects said device to said circuitry, said conductor being in the form of a thin, narrow, deposited track of said board, and the length of said conductor being at least several centimetres.

* * * * *

UNITED STATES PATENT AND TRADEMARK OFFICE
CERTIFICATE OF CORRECTION

PATENT NO. : 7,276,697 B2  
APPLICATION NO. : 10/503188  
DATED : October 2, 2007  
INVENTOR(S) : Michael Leslie Devine It is certified that error appears in the above-identified patent and that said Letters Patent is hereby corrected as shown below:

Column 8, Line 6, Claim 28, please delete "car" before "shrouding" and insert --cap--

Signed and Sealed this

Eighteenth Day of March, 2008

JON W. DUDAS  
*Director of the United States Patent and Trademark Office*